United States Patent [19]

Belcher

[11] Patent Number: 4,585,157
[45] Date of Patent: Apr. 29, 1986

[54] TAPE BONDING OF TWO INTEGRATED CIRCUITS INTO ONE TAPE FRAME

[75] Inventor: Stephen R. Belcher, Kokomo, Ind.

[73] Assignee: General Motors Corporation, Detroit, Mich.

[21] Appl. No.: 719,987

[22] Filed: Apr. 4, 1985

[51] Int. Cl.[4] .............. B23K 31/02; B23K 1/12
[52] U.S. Cl. .................. 228/180.2; 228/6.2; 228/44.7
[58] Field of Search .......... 228/180.2, 6.2, 44.7; 29/741

[56] References Cited

U.S. PATENT DOCUMENTS

| | | | |
|---|---|---|---|
| 3,777,221 | 12/1973 | Tatusko et al. | 228/180.2 |
| 3,871,936 | 3/1975 | Boyer et al. | 228/180.2 |
| 4,283,839 | 8/1981 | Gursky | 228/180.2 |
| 4,371,912 | 2/1983 | Guzik | 228/180.2 |

Primary Examiner—Nicholas P. Godici
Assistant Examiner—Samuel M. Heinrich
Attorney, Agent, or Firm—Randy W. Tung

[57] ABSTRACT

A method of bonding two integrated circuit chips in a face-to-face relationship to a single site of finger leads situated in a tape-type lead frame. The finger leads contained at a single site in a lead frame are divided into two groups and are bonded in two separate bonding processes. The first group has its inner free ends configured in combination with contact bumps on a first chip, effective to leave the second group of finger leads outside the peiphery of the first chip after bonding of the first chip to the tape. In the second bonding process, a second integrated circuit chip is placed beneath the tape that has a first integrated circuit chip already bonded to the top side of it and a heated thermode having a recess in its surface. The peripheral edge of the thermode is used to complete bonding of the second integrated circuit chip to the second group of finger leads at the same site of the lead frame.

3 Claims, 15 Drawing Figures

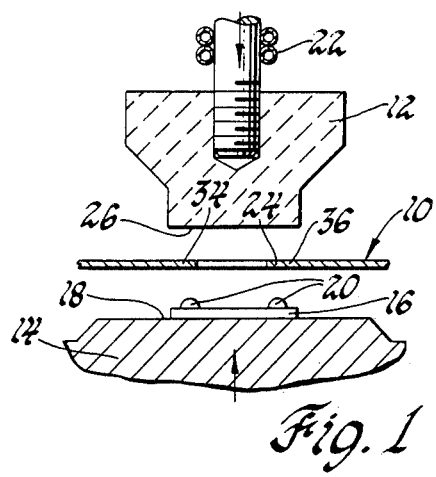
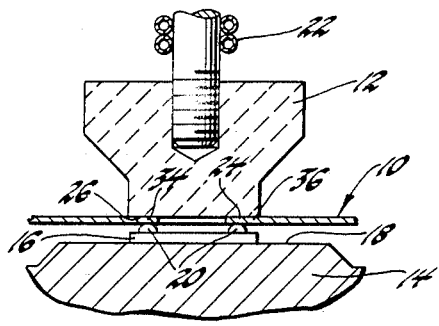
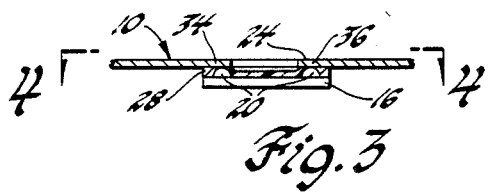
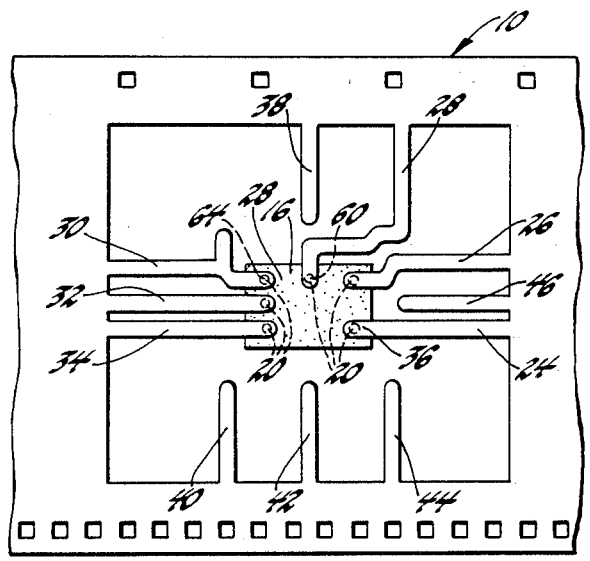
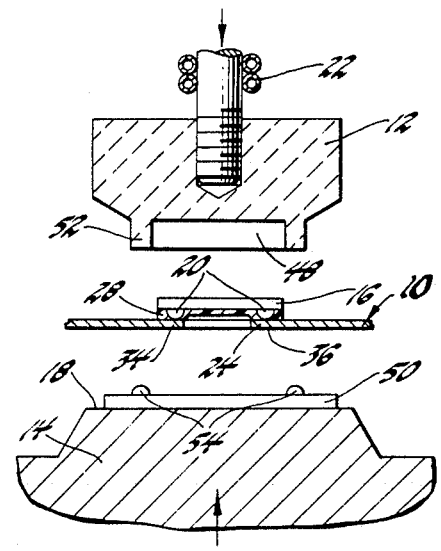
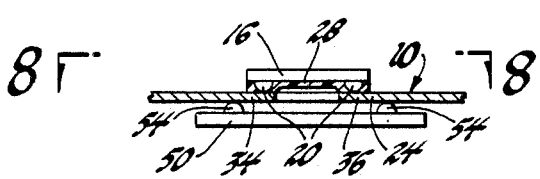

TAPE BONDING OF TWO INTEGRATED CIRCUITS INTO ONE TAPE FRAME

FIELD OF THE INVENTION

This invention relates generally to a method of bonding integrated circuit (IC) chips to a lead frame tape and, more particularly, to a method of bonding two integrated circuit chips in a face-to-face relationship to a single site of finger leads situated in a tape-type lead frame.

BACKGROUND OF THE INVENTION

In recent years, techniques of using an automated tape bonding process when packaging integrated circuit chips have been developed in an attempt to replace other lead frame wire bonding methods currently used in packaging integrated circuit chips.

In a tape bonding process, an integrated circuit chip is directly bonded to a foil type lead frame that is usually less than about 0.5 mm in thickness. Such a technique is also referred to as tape automated bonding (TAB). In any event, in the usual tape bonding process, a bare copper, a gold or tin plated copper, or copper/plastic laminated tape is first prepared that has leads etched into it at positions corresponding to the gold plated bumps over aluminum bonding pads on the integrated circuit chip. The tape is then fed into an inner lead bonder, which is an apparatus having a thermode. A thermode is a heated instrument that presses the chip and tape together. The inner ends of the leads are bonded to the bumps on the integrated circuit chip by compressing them under the heated thermode in a single operation. Then the integrated circuit chip and bonded leads can be excised out of the tape for connection to a circuit board.

In the present state of the art of tape bonding, the high cost of mounting and testing of a chip at a single site on the tape provides a hindrance to the widespread implementation of this process into production. The cost of inspecting and testing a single integrated circuit chip at a site of lead frame is a significant portion of the manufacturing cost, as well as the chip mounting cost.

Therefore, it is an object of the present invention to provide a method of tape bonding integrated circuit chips that is more cost efficient and suitable for a mass production process.

It is another object of this invention to provide a tape bonding method for integrated circuit chips where two chips may be bonded to the same or different finger leads at a single site in a lead frame. The two chips can be either the same, different, mutually cooperative or mutually uncooperative.

It is yet another object of this invention to provide a tape bonding method for integrated circuit chips where two chips may be bonded to a single site of finger leads in a lead frame and then be inspected and tested in one operating step.

It is still another object of this invention to provide a tape bonding method for integrated circuit chips where two chips may be bonded in a face-to-face relationship to a single site of finger leads in a lead frame by using one inner lead bonder machine.

SUMMARY OF THE INVENTION

This invention involves a new technique for bonding integrated circuit chips to a circuit board using the tape bonding approach. One unique feature of this process is that the finger leads contained at a single site in a lead frame are divided into two groups and are bonded in two separate bonding processes. The first group has its inner free ends configured in combination with contact bumps on a first chip, effective to leave the second group of leads outside the periphery of the first chip after bonding of the first chip to the tape. As in the conventional tape bonding method, a thermode in an inner lead bonder is used to bond the first group of finger leads etched in a tape to a first integrated circuit chip. In a preferred embodiment of my technique, the tape with the first type of integrated circuit chips bonded to it is then rolled back up onto a reel and then run through the inner lead bonder again. This time the tape is run across a different thermode with the previously bonded first integrated circuit chip on the face of the tape opposite from the different thermode, i.e., on top of the tape. A second integrated circuit chip, which could be the same or different in function and/or lead pattern than the first integrated circuit chip, is placed beneath the tape and a heated thermode having a recess in its face. The peripheral edge of the thermode is used to complete bonding of the second integrated circuit chip to the second group of finger leads at the same site of lead frame.

BRIEF DESCRIPTION OF DRAWINGS

Other objects, features and advantages of this invention will become apparent upon consideration of the specification and the appended drawings, in which:

FIG. 1 is a schematic view showing a metal lead frame and a first integrated circuit chip positioned under a thermode before bonding.

FIG. 2 is a view similar to FIG. 1 but showing the thermode compressing the metal lead frame and the first integrated circuit chip together.

FIG. 3 is a schematic view showing the integrated circuit chip after being bonded to the lead frame and passivated with an elastomer coating.

FIG. 4 is a plan view of FIG. 3 along line 4—4 showing long finger leads and short finger leads in a site of lead frame wherein the long finger leads are bonded to the first integrated circuit chip.

FIG. 5 is a schematic view showing the second bonding operation in my process wherein the first integrated circuit chip is flipped upside down and fed below a second thermode that has a recess in its surface to accommodate the first integrated circuit chip.

FIG. 6 is a view similar to FIG. 5 but showing the thermode compressing the metal lead frame and the second integrated circuit chip together.

FIG. 7 is a schematic view showing the lead frame after the second bonding operation with the two integrated circuit chips bonded face-to-face at the same tape location.

DETAILED DESCRIPTION OF THE PREFERRED EMBODIMENT

Figure 8:
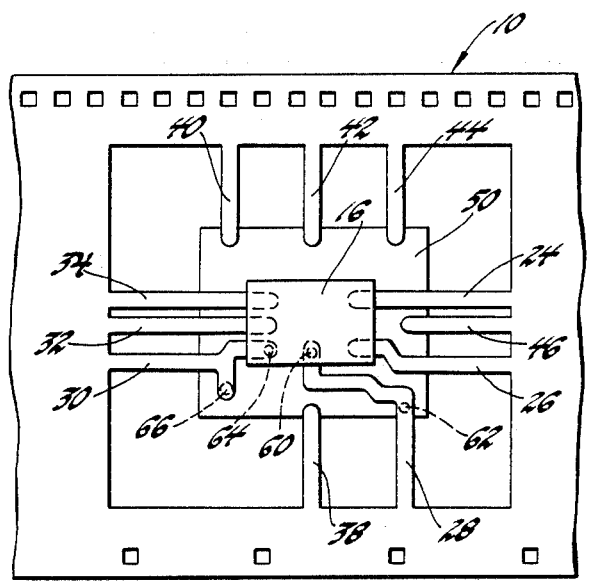
FIG. 8 is a plan view along the line 8—8 of FIG. 7.

This innovative technique overcomes the shortcomings of the current tape bonding method by allowing the double usage of both a bonding site of tape and the circuit board area necessary for placing the integrated circuit chip into use. Another advantage is that since two integrated circuits can be attached with no performance losses, two smaller chips could be used to replace a single larger integrated circuit chip with an increase in production yield and therefore a possible decrease in cost.

One other advantage of this new bonding technique is that interconnections could be made in between the top integrated circuit chip and the base integrated circuit chip in the bonding process. This makes possible an arrangement where a power chip and a control chip is combined into one assembly for easier mounting on the circuit board. Similarly, the top integrated circuit chip could be one that contains all the transistors while the bottom integrated circuit chip could be one that contains all the resistors and capacitors. When the same chip is used as the top chip and the bottom chip, the production yield of this tape bonding process is effectively doubled.

Still another advantage of this new bonding technique is that the inspection or testing of the two chips, regardless if they are the same or not, can be performed in one test function resulting in added savings.

The practice of the present invention of bonding two integrated circuit chips to two separate groups of finger leads at the same site of a lead frame tape is described in the following preferred embodiment.

Referring initially to FIG. 1, a length of copper tape 10 is loaded into an inner lead bonder machine between thermode 12 and anvil 14. A first integrated circuit chip 16 is provided and positioned on the flat top 18 of anvil 14 with gold tipped or solder tipped contact bumps 20. Contact bumps 20 face upward. An electric resistance heating coil 22 is used to heat thermode 12 of the inner lead bonder. A suitable copper tape for this process was found to be 0.0028 inch thick non-plated copper of 2 oz weight supplied by Minnesota Mining & Manufacturing Co. A gold or tin plated copper tape could also be used.

The contact bumps 20 can be made in any of the normal and accepted ways for TAB. For example, contact bumps 20 can be prepared by first building up an aluminum pad to about 12,000 angstroms in height. The aluminum contact bump is covered with sputtered layers of titanium and an alloy of tungsten. Each layer is about 2,000–3,000 angstroms thick and has a combined thickness of about 5,000 angstroms. A thin layer of about 1,000 angstroms of gold is then sputtered on top. As the final step, a gold layer of 0.001 inch in thickness is plated on top of the sputtered gold layer.

Thermode 12 is then lowered to contact tape 10 and integrated circuit chip 16. FIG. 2 shows thermode 12 in a closed position wherein etched finger leads 24 in tape 10 are pressed against gold tipped or solder tipped bumps 20 between thermode surface 26 and anvil surface 18. The usual time, temperature, and bonding pressure used are 0.8 sec, 525° C., and 200 gms/bump respectively. However, it is to be understood that bonding pressure can be adjusted based on the heat input from heating coil 22 and the time desired for each particular bonding process.

Optionally, after tape 10 and integrated circuit chip 16 are bonded together, a drop of silicone elastomer 28 can be placed on integrated circuit chip 16 to passivate the chip. This passivation not only prevents the integrated circuit chip from being damaged during handling and processing, but also prevents it from being damaged by moisture. A passivated chip is shown in FIG. 3.

FIG. 4 is a top view of FIG. 3 showing the integrated circuit chip 16 bonded to tape 10. It is to be noticed that long finger leads 24, 26, 28, 30, 32 and 34 are bonded to the first integrated circuit chip 16 at their fingertips, e.g., fingertip 36 of long finger lead 24. Note that short finger leads 38, 40, 42, 44 and 46 are free and not bonded at this stage of the process.

At this stage of the process, tape 10 having a first integrated circuit chip bonded to it can be further processed by either one of two methods. One method is to reel up the tape onto a spool with a protective film in between, turn the reel over, and then un-reel it such that the first bonded integrated circuit chip is now on top. To utilize the same inner lead bonder, thermode 12 is changed to one that has a recess 48 in its surface in order to accommodate the first integrated circuit chip 16. This is shown in FIG. 5. Tape 10 is then fed into the inner lead bonder machine for the second integrated circuit chip bonding operation.

A second method which may be more preferable in a production setup is to simply flip over tape 10 after the first bonding operation and feed the tape directly into a second inner lead bonder machine equipped with a thermode of recessed surface 48 (FIG. 5).

In the second bonding operation, shown in FIGS. 5 and 6, a second integrated circuit chip 50 of a size larger than that of the first integrated circuit chip 16 is bonded to tape 10. FIG. 6 shows this bonding operation where the periphery section 52 of thermode 12 is pressed against tape 10 and gold tipped or solder tipped bumps 54 on the second integrated circuit chip 50. FIG. 7 shows tape 10 after the second bonding operation having a first integrated circuit chip 16 and a second integrated circuit chip 50 bonded to it in a face-to-face relationship.

A plan view of a completed assembly shown in FIG. 7 is shown in FIG. 8. It is seen that short finger leads 38, 40, 42, 44 and 46 are now connected at finger tips to the second integrated circuit chip 50 in the second bonding operation.

Interconnections between the first integrated circuit chip and the second integrated circuit chip can be made during the second bonding operation. for instance, it is shown in FIG. 8 that long finger lead 28 is used to connect the first integrated circuit chip (at bumping pad 60) and the second integrated circuit chip (at bumping pad 62). A similar interconnection is made by finger lead 30 where the first integrated circuit chip is connected at 64 to the second integrated circuit chip at 66. This technique of interconnecting chips provides other attractive alternatives of building novel combinations of integrated circuit chips. For instance, the first integrated circuit chip may be a control chip while the second integrated circuit chip may be a power chip making it a compact assembly ready to be connected to a circuit board. Another useful combination can be made by placing all the transistors on one chip and all the resistors and capacitors on the other chip and then connecting them into an assembly.

Figure 9:
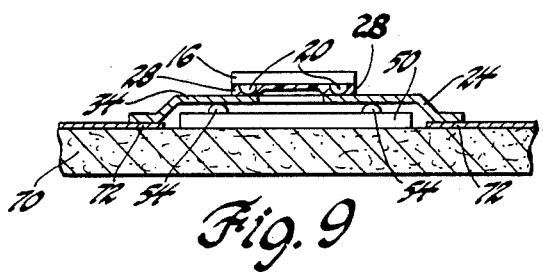
FIG. 9 is a schematic view showing the FIG. 7 embodiment after it is excised out of the tape and bonded to a circuit.

After the second bonding operation, the outer ends of the finger leads are separated from the tape leaving the chip supported by some insulating means such as an adhesive tape or a molded plastic ring. The two chips can then be tested and inspected in one operating step resulting in great savings in both labor and time. After testing, the two chips can be mounted on a circuit board as an assembly. FIG. 9 shows that finger leads 24 are connected to metal contacts 72 located on substrate 70.

Figure 10:
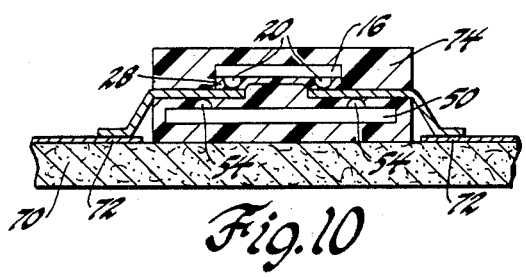
FIG. 10 is a schematic view showing the FIG. 7 embodiment first potted in plastic and then mounted on a circuit board.

Instead of mounting the two chips directly on a circuit board after testing, another alternative is to pot the integrated circuit chip assembly in plastic first and then mount it. This is shown in FIG. 10. Integrated circuit chips 16 and 50 are potted in plastic 74 to protect them from damages caused by handling and moisture.

Figure 12:
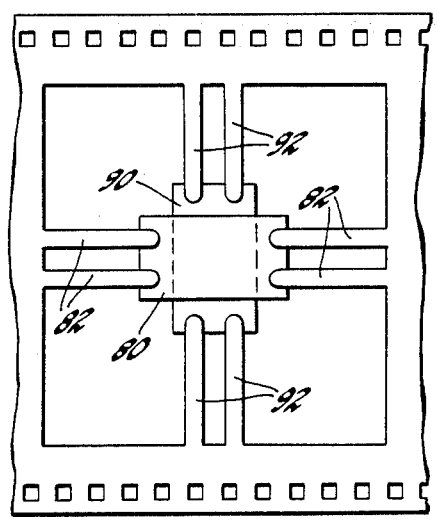
FIG. 12 is a schematic view showing the product of the second bonding operation in the FIG. 11 embodiment.
Figure 13:
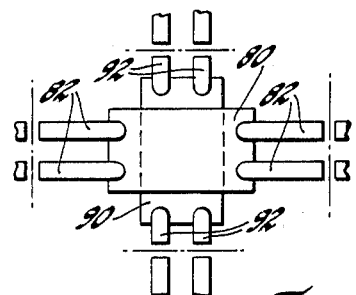
FIG. 13 is a schematic view showing the FIG. 12 integrated circuit chips excised out of the lead frame tape.
Figure 14A:
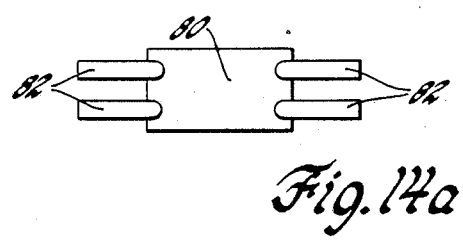
FIGS. 14a and 14b are schematic views showing that the FIG. 13 integrated circuit chips need not be used together but can be cut separately and used independently.
Figure 11:
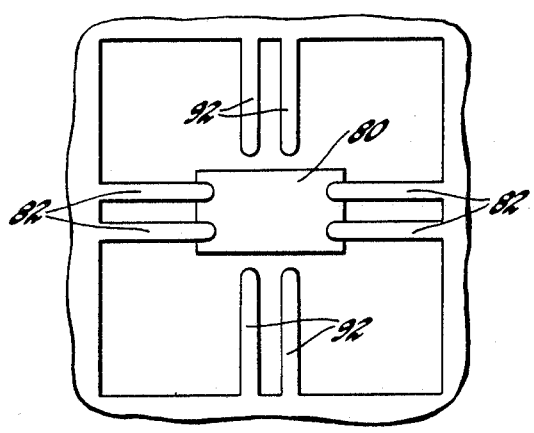
FIG. 11 is a schematic view showing the product of the first bonding operation for an alternate embodiment of the current invention where two rectangular chips of the same size are bonded to the same lead frame tape site.
Figure 14B:
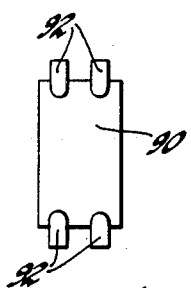

It should be noted that the preferred embodiment discussed above is by no means the only way the current invention could be practiced. Even though the use of two different integrated circuit chips was illustrated in the preferred embodiment, the two integrated circuit chips need not be different. For instance, two integrated circuit chips of the same size can be connected to a single site of finger leads in a lead frame. This is shown in FIGS. 11 and 12. FIG. 11 shows that integrated circuit chip 80 is connected in the first bonding process to finger leads 82 in the horizontal position. Note that all the finger leads in this lead frame are of the same length. In plan view, a second rectangular integrated circuit chip 90 of the same type is disposed at 90° from the first rectangular chip. In this manner, its contact bumps are outside the periphery of the first chip. These contact bumps are then connected to the other four finger leads 92. This is shown in FIG. 12. The two identical integrated circuit chips are tested first and then excised from their lead frame as shown in FIG. 13. The two chips can either be used together as a package or they can be separately used as two independent chips. FIGS. 14a and 14b show the case where two chips are used independently. One additional requirement to be met in bonding two similar chips to the same site of lead frame is that the first chip must not cover the finger leads intended to be bonded to the second chip. The contact bumps on the second chip can be approximately located to contact the uncovered fingers. The two chips can be offset in any way as long as this requirement is satisfied. In this alternate embodiment shown in FIGS. 11 and 12, testing and inspection can be performed either before the two chips are separated or after they are separated. However, testing the chips before they are separated is more economical.

While my invention has been described in terms of a preferred embodiment thereof, it is to be appreciated that those skilled in the art will readily apply these teachings to other possible variations of the invention.

The embodiments of the invention in which an exclusive property or privilege is claimed are defined as follows:

1. A method of tape bonding two integrated circuit chips in a face-to-face relationship to a single site of finger leads situated in a tape type lead frame comprising the steps of:
    providing a first integrated circuit chip having a plurality of contact pads situated on a surface of said chip,
    providing a length of said tape containing a plurality of said sites each having a first and a second group of finger leads, each finger lead having an inner free end, said tape having first and second opposed major surfaces,
    bonding said inner free ends of said first group of finger leads in one such site to the corresponding contact pads on said first chip such that contact bumps interconnect the chip contact pads to the first group of finger leads on said first major surface of the tape by compressing said finger leads and said chip between a heated thermode member and an anvil member,
    providing a second integrated circuit chip having a plurality of contact pads situated on a surface of said chip that cooperate with the second group of finger leads to provide interconnection sites outside the periphery of the first integrated circuit as bonded to the lead frame site,
    bonding said inner free ends of said second group of finger leads in said site to the corresponding contact pads on said second chip by compressing said finger leads and said chip between a thermode member and an anvil member, said thermode member having a recess in its surface accommodating said first bonded chip so that no pressure is applied to said chip when bonding the second group of finger leads to the second chip.

2. A method of tape bonding two integrated circuit chips in a face-to-face relationship to a single site of finger leads situated in a tape type lead frame comprising the steps of:
    providing a length of said tape containing a plurality of said sites each having a first and a second group of finger leads, each finger lead having an inner free end, said tape having a top and a bottom surface,
    providing a first integrated circuit chip having a plurality of contact pads situated on a surface of said chip,
    bonding said inner free ends of said first group of finger leads in one such site to contact bumps on the chip contact pads interconnect the first group of finger leads on said bottom surface of the tape by compressing said finger leads and said chip between a heated thermode member and an anvil member situated in an inner lead bonder machine,
    flipping said tape in an upside down position such that said bottom surface of the tape containing said first bonded chip is facing upward,
    feeding said tape in said upside down position through an inner lead bonder machine containing a heated thermode member and an anvil member, said thermode member having a recess in its surface accommodating said first bonded chip,
    providing and positioning a second integrated circuit chip having a plurality of contact pads situated on a surface of said chip on said anvil member of said second inner lead bonder machine, said contact pads cooperate with the second group of finger leads to provide interconnection sites outside the periphery of the first integrated circuit as bonded to the lead frame site, bonding said inner free ends of said second group of finger leads in said site to contact bumps on the second chip by compressing the lower surface of said finger leads and said second chip between said heated thermode member and said anvil member, whereby the recess in the surface of said thermode member accommodates said first bonded chip such that no pressure is applied on said first chip when bonding the second chip to the lead frame.

3. A method of tape bonding two integrated circuit chips in a face-to-face relationship to a single site of finger leads situated in a tape type lead frame comprising the steps of:

providing a length of said tape containing a plurality of said sites each having a first and a second group of finger leads, each finger lead having an inner free end, said tape having a first and a second major opposed surface, providing a first integrated circuit chip having a plurality of contact bumps on the chip contact pads situated on a surface of said chip, bonding said inner free ends of said first group of finger leads in one such site to contact bumps on the chip contact pads interconnect the first group of finger leads on said first major surface of the tape by compressing said finger leads and said chip between a first thermode member and an anvil member situated in an inner lead bonder machine, reeling said tape onto a spool mounted in said bonder machine, turning said spool upside down and remounting said spool in said bonder machine, replacing said first thermode member in said bonder machine with a second thermode member having a recess in its surface to accommodate said first bonded chip, unreeling and positioning said tape between said second thermode member and said anvil member such that said first bonded chip being on top of said tape and being accommodated by the recess in said thermode member, providing and positioning a second integrated circuit chip having a plurality of contact pads situated on a surface of said chip on said anvil, said contact pads cooperate with the second group of finger leads to provide interconnection sites outside the periphery of the first integrated circuit as bonded to the lead frame site, bonding said inner free ends of said second group of finger leads in said site to contact bumps on the second chip by compressing said finger leads and said second chip between said second heated thermode member and said anvil member, said thermode member having a recess in its surface accommodates said first bonded chip such that no pressure is applied on said first chip when bonding said second chip to the lead frame.

* * * * *